(12) United States Patent
Solski et al.

(10) Patent No.: US 7,440,729 B2
(45) Date of Patent: Oct. 21, 2008

(54) APPARATUS, METHODS AND ARTICLES OF MANUFACTURE FOR OUTPUT IMPEDANCE MATCHING USING MULTI-BAND SIGNAL PROCESSING

(75) Inventors: Piotr Solski, Blackrock (IE); Andrei Grebennikov, Little Island (IE); Eugene Heaney, Rochestown (IE)

(73) Assignee: M/A-Com Eurotec B.V., Blackrock County of Cork (IE)

( * ) Notice: Subject to any disclaimer, the term of this patent is extended or adjusted under 35 U.S.C. 154(b) by 771 days.

(21) Appl. No.: 10/826,515

(22) Filed: Apr. 16, 2004

(65) Prior Publication Data
US 2005/0233764 A1    Oct. 20, 2005

(51) Int. Cl.
*H04B 1/68* (2006.01)

(52) U.S. Cl. .......................... 455/46; 455/552.1; 455/15

(58) Field of Classification Search .............. 455/522.1, 455/550.1, 78, 73, 83, 553.1, 552, 80, 15, 455/428, 452.2, 9, 10, 46, 82, 159, 115; 343/787
See application file for complete search history.

(56) References Cited

U.S. PATENT DOCUMENTS

| | | | |
|---|---|---|---|
| 5,669,068 A | 9/1997 | Kielmeyer et al. | |
| 5,673,001 A | 9/1997 | Kim et al. | |
| 5,673,287 A | 9/1997 | Colvis et al. | |
| 5,890,051 A | 3/1999 | Schlang et al. | 455/76 |
| 5,952,870 A | 9/1999 | Urban | |
| 6,020,787 A | 2/2000 | Kim et al. | |
| 6,091,966 A * | 7/2000 | Meadows | 455/553.1 |
| 6,215,355 B1 | 4/2001 | Meck et al. | 330/51 |
| 6,317,608 B1 | 11/2001 | Glöcker | |
| 6,366,788 B1 | 4/2002 | Fujioka et al. | 455/553 |
| 6,400,963 B1 * | 6/2002 | Glockler et al. | 455/553.1 |
| 6,510,310 B1 * | 1/2003 | Muralidharan | 455/83 |
| 6,522,201 B1 | 2/2003 | Hsiao et al. | |
| 6,556,814 B1 | 4/2003 | Klomsdorf et al. | |
| 6,559,808 B1 * | 5/2003 | Petzold et al. | 343/787 |
| 6,680,652 B2 | 1/2004 | Hoheisel et al. | 330/302 |
| 6,765,536 B2 | 7/2004 | Phillips et al. | |
| 6,906,996 B2 | 6/2005 | Ballantyne | 370/204 |
| 6,990,164 B2 | 1/2006 | Bushman et al. | |
| 7,076,216 B2 * | 7/2006 | Hayashi | 455/78 |
| 2004/0208157 A1 | 10/2004 | Sander et al. | 370/345 |
| 2004/0263245 A1 | 12/2004 | Winter et al. | 330/10 |
| 2005/0064830 A1 | 3/2005 | Grigore | 455/127.4 |
| 2005/0110565 A1 | 5/2005 | Robinson | 330/124 R |
| 2005/0110568 A1 | 5/2005 | Robinson et al. | 330/151 |

* cited by examiner

Primary Examiner—Tan Trinh

(57) ABSTRACT

Apparatus, methods and articles of manufacture for output impedance matching in multi-band power amplification are provided, wherein an output matching configuration comprising one or more output matching sections, a multi-band diplexer and a switch are connected to an active device.

19 Claims, 5 Drawing Sheets

US 7,440,729 B2

APPARATUS, METHODS AND ARTICLES OF MANUFACTURE FOR OUTPUT IMPEDANCE MATCHING USING MULTI-BAND SIGNAL PROCESSING

FIELD OF THE INVENTION

The invention relates to signal processing, and more particularly to output impedance matching for multi-band power amplifiers.

BACKGROUND OF THE INVENTION

Power amplifiers used in transmitters may be optimized for use in a particular mode and frequency band to maximize efficiency. Such optimization may require the amplifier to be biased in a certain manner. Additionally, impedances usually need to be matched between components within the amplifier and between the amplifier and adjacent components.

Difficulties arise, however, with the demands some communication systems place upon an amplifier. For example, in a W-CDMA or CDMA2000 transmitter, a signal with a non-constant envelope is traditionally fed through a power amplifier. However, it is difficult to reach optimum levels of amplifier efficiency and linearity: design compromises between the two are often required. Moreover, a wide range of output power is required: typically on the order of 80 dB.

Further difficulties may arise with multi-band transmitters. For example, impedance is dependant on the operating frequency, and therefore, an amplifier having optimal impedance matching in one frequency band will not be optimized for operation in a different frequency band. Problems related to impedance matching at different frequencies may be solved by providing separate amplifying chains. However, separate amplifying chains can be costly, increase the size of the transmitter and increase the power required for the transmitter.

Amplifier design and impedance matching is further made difficult because, in present communication systems, it is desirable for an amplifier to operate over multiple frequency bands. For example, a transmitter may be used in GSM900 (880-915 MHz) and DCS1800 (1710-1785 MHz) bands. As another example, a transmitter may be used in CDMA2000 (824-849 MHz and 1850-1910 MHz) or PCS1900 (1850-1910 MHz) frequency bands. Typically, dual-band mobile phone transceivers contain two power amplifiers, each operating within a single frequency bandwidth, and each requiring impedance matching.

The prior art has attempted to provide solutions to amplifier design and impedance matching difficulties. For example, FIG. 1 shows one prior art attempt at impedance matching for a dual-band single-stage power amplifier operating in either the 800 MHz or the 1900 MHz bands. A single active device includes switching impedance networks 104 and 106 at the input, an amplifier 102, a bias control 103, a voltage source 107, a switching impedance network 105 and switching impedance networks 108 and 110 at the output, to provide desired input and output impedances. The need for these switching impedance networks, however, drives up the cost of the device and drives down the efficiency.

Another approach to impedance matching in a dual-band power amplifier is shown in FIG. 2. An amplifier 214 is matched to a first matching circuit 202. A second matching circuit 204 consisting of two separate impedance networks 206 and 208 is tuned to each frequency bandwidth. Two switches 210 and 212 are necessary to this approach. This approach again drives up the cost of the device while driving down the efficiency.

Accordingly, there is a need for improved output matching for a multi-band power amplifier.

SUMMARY OF THE INVENTION

Apparatus, methods and articles of manufacture for multi-band signal processing are provided. In one exemplary embodiment, an output matching configuration is provided comprising at least one output impedance matching section, a multi-band diplexer and a switch.

DETAILED DESCRIPTION

Figure 1:
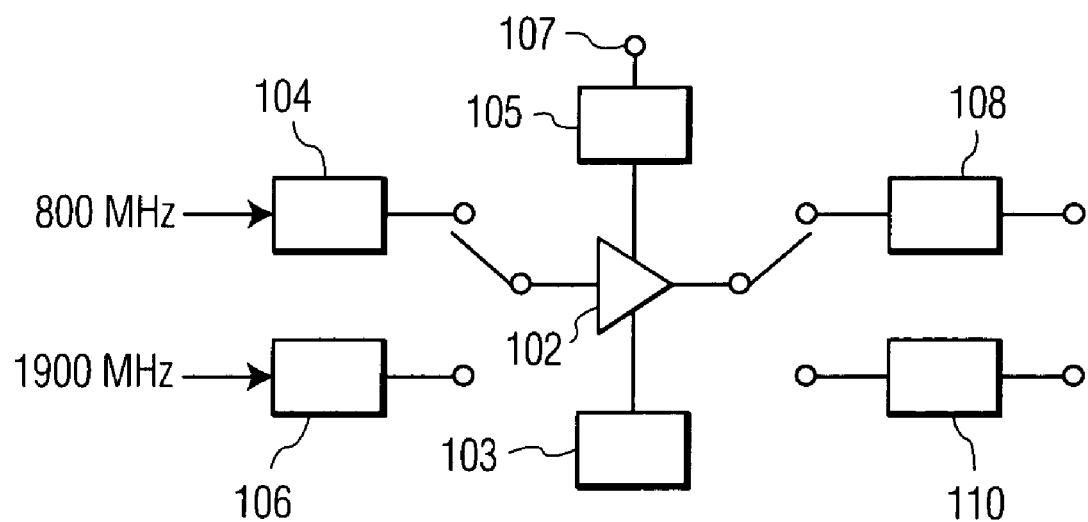
FIG. 1 depicts a prior art dual-band device.
Figure 2:
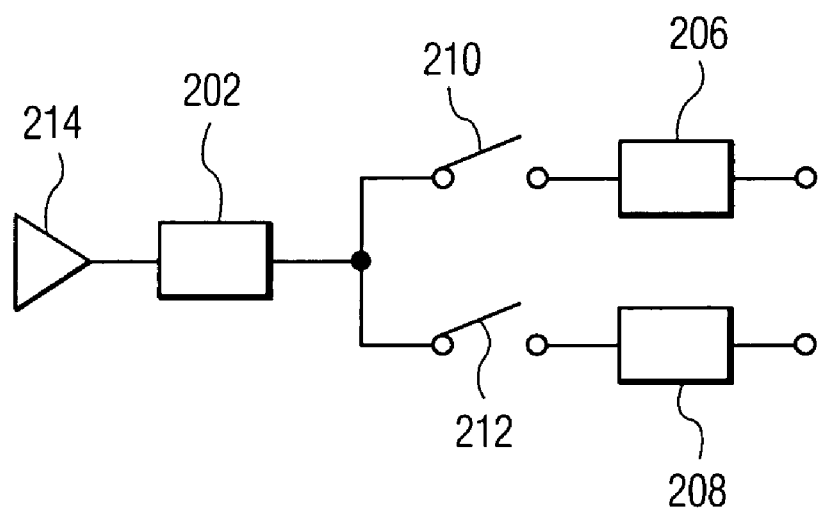
FIG. 2 depicts a prior art dual-band device.
Figure 3:
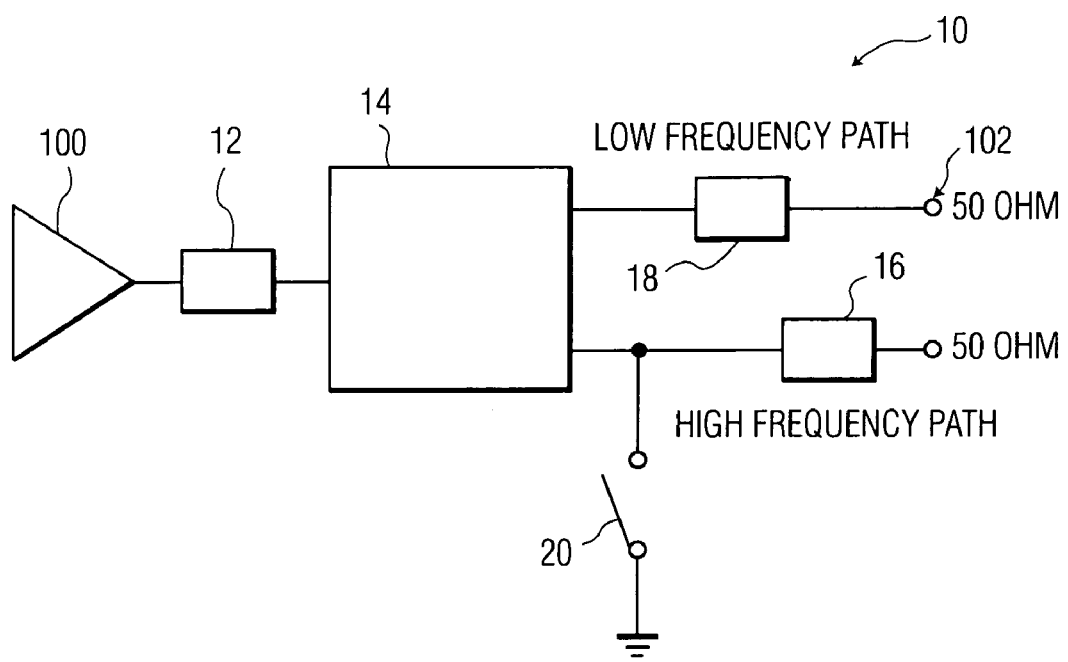
FIG. 3 shows an embodiment of an output matching configuration.

The present invention comprises apparatus, methods and articles of manufacture for output impedance matching using multi-band signal processing, such as, for example, output impedance matching for multi-band power amplifiers utilized in cellular phones. FIG. 3 shows an exemplary embodiment comprising an output matching configuration 10. The output matching configuration 10 as shown is connected at its input end to an active device comprising a power amplifier 100 and is connected at its output end to a load 102, such as, for example, an antenna. In this embodiment, the output matching configuration 10 comprises, as portions thereof, a broadband output matching section 12, a multi-band diplexer comprising a dual-band diplexer 14, two single-band matching sections 16 and 18, respectively, and a switch 20.

The broadband output matching section 12 is connected at its input end to the output terminal of the power amplifier 100 and at its output end is connected with the dual-band diplexer 14. In one exemplary embodiment, the broadband matching section 12 provides broadband matching from approximately 5 Ohms to 10-15 Ohms, although as should be understood, any other desired ranges can also be provided.

The dual-band diplexer 14 at its output end is connected with the single-band matching sections 16 and 18, respectively. The power amplifier 100 in this embodiment transmits input signals in one or more defined frequency bands that are received by the dual-band diplexer 14. For example, in a dual band system, such as a system operating at GSM/DCS modes, the input signals transmitted from the power amplifier 100 can be regulated between two different frequency bands depending on whether the system is operating at GSM mode or DCS mode. The dual-band diplexer 14 processes the input signals according to the signal's particular frequency band and then generates output signals to the single-band matching sections 16 and 18. In this embodiment, the dual-band diplexer 14 generates first output signals, preferably in the higher frequency band, to the single-band matching section 16 and generates second output signals, preferably in the lower frequency band, to the single-band matching section 18, which will be described in more detail below. The single-band matching sections 16 and 18 are each preferably tuned to a particular bandwidth, in accordance with designated frequency bands of the system. For example, in a dual band system, the single-band matching section 16 is tuned according to a first operating frequency, preferably higher frequency bands, and the single-band matching section 18 is tuned according to a second operating frequency, preferably lower frequency bands. In the present embodiment, the single-band matching sections 16 and 18 operate to realize high-efficiency operation of both low and high frequency bands separately.

The switch 20, such as a PIN-diode, is disposed between the dual-band diplexer 14 and the single-band matching section 16, which operates to suppress undesired harmonics from lower frequency bands. Generally, where a power amplifier outputs signals of multiple transmitting frequencies, undesired harmonics can arise when harmonics of the lower transmitting frequency lie below or are identical to the higher transmitting frequency. For example, in a dual band architecture comprising GSM/DCS modes, undesired harmonics would be suppressed from GSM mode which are located exactly in DCS bandwidth, and in a dual band architecture comprising CDMA2000 modes, undesired harmonics would be suppressed from the 825-849 MHz mode which are very close to the 1850-1910 MHz mode.

In a first operative mode in accordance with the present embodiment, where a signal of a first, lower frequency band is transmitted from the power amplifier 100 ([e.g., 824-849 MHz or 880-915 MHz), the PIN-diode 20 is turned on, shortening undesired harmonics without any effect on the electrical performance of the lower frequency transmission. Further, in a second operative mode in accordance with the present embodiment, where a signal of a second, higher frequency band is transmitted from the power amplifier 100, (e.g., 1710-1795 MHz or 1850-1910 MHz) the PIN-diode 20 is turned off, resulting with a very high impedance at the higher frequency band.

In accordance with the present embodiment, a single multi-band amplifier can be realized in which the level of output power is approximately the same for varying frequencies, for example, linear output power of 28.5 dBm for CDMA 2000 (824-849 MHz) mode and 29 dBm for CDMA 2000 (1850-1910 MHz) mode frequency bands, and saturated output power of 35 dBm for GSM800 and 33 dBm for DCS1800 frequency bands.

Various circuit configurations and technologies can be utilized for the components of the output matching configuration 10. Some examples are described below.

The PIN-diode 20, as an example, may be replaced by any switchable band stop filter. Other suitable switches may also be utilized as well.

Figure 4:
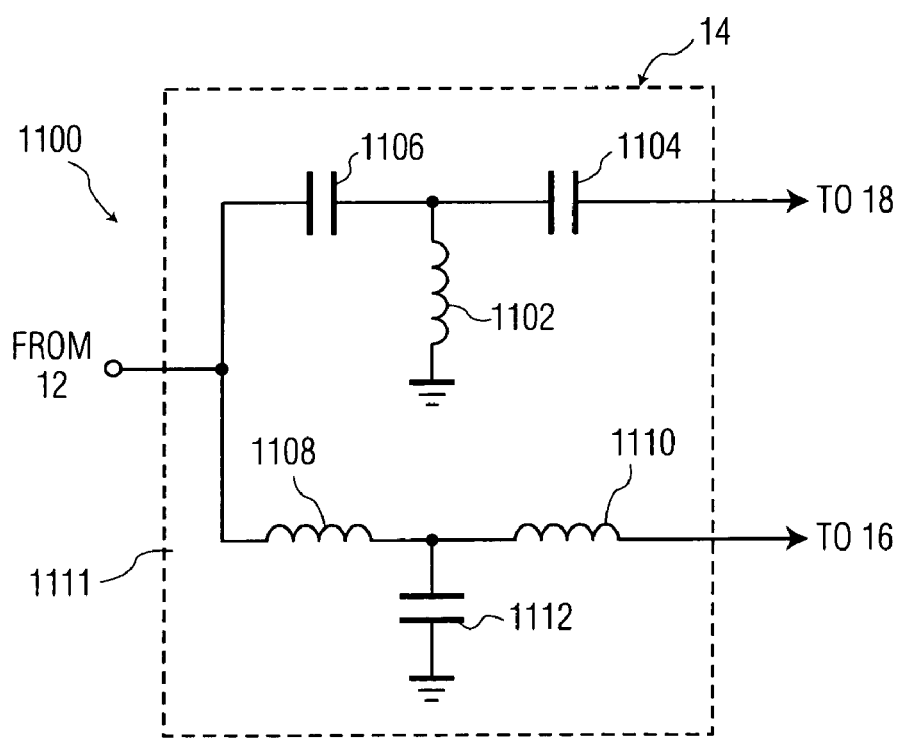
FIG. 4 shows an embodiment of a dual-band diplexer.

An exemplary embodiment of a diplexer suitable for the dual-band diplexer 14 is shown in FIG. 4 comprised of high-pass and low-pass filters. High pass filter 1100 comprises inductor 1102 and capacitors 1104 and 1106. Low pass filter 1111 comprises inductors 1108 and 1110 and capacitor 1112. In yet other embodiments, the inductors may be replaced by a short transmission line with high characteristic impedance and the capacitors may be replaced by an open-circuit stub.

Figure 5:
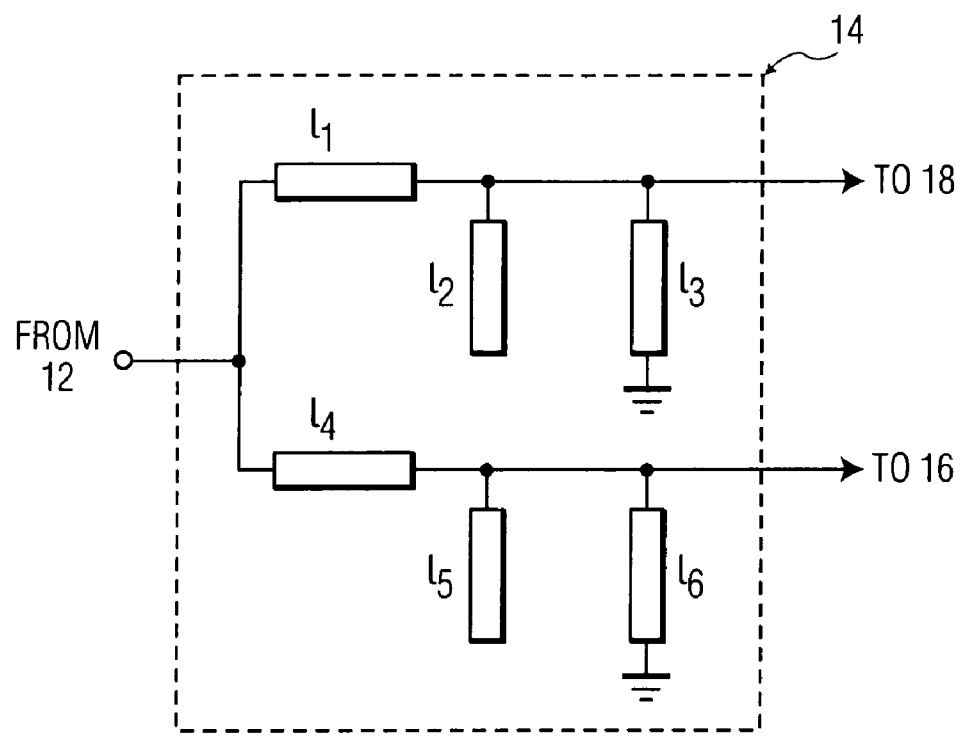
FIG. 5 shows an embodiment of a dual-band diplexer.

Alternatively, in yet another embodiment, the dual-band diplexer 14 may be formed with quarter-wave or half-wave transmission lines as shown in FIG. 5. In this embodiment, the transmission line lengths $l_1$ and $l_2$ are quarter-wave at 800 MHz to protect the higher frequency path from the lower frequency signal whereas lengths $l_4$ and $l_5$ are quarter-wave at 1900 MHz to protect the lower frequency path from the higher frequency signal. To reduce or eliminate any additional required matching, length $l_3$ is chosen to realize the parallel equivalent circuit with an open-circuit stub, i.e. the overall length $l_2+l_3$ should be half-wave at 1900 MHz as well as the overall length $l_5+l_6$, should be half-wave at 800 MHz. The series transmission lines preferably have 50 Ohm characteristic impedances.

Figure 6:
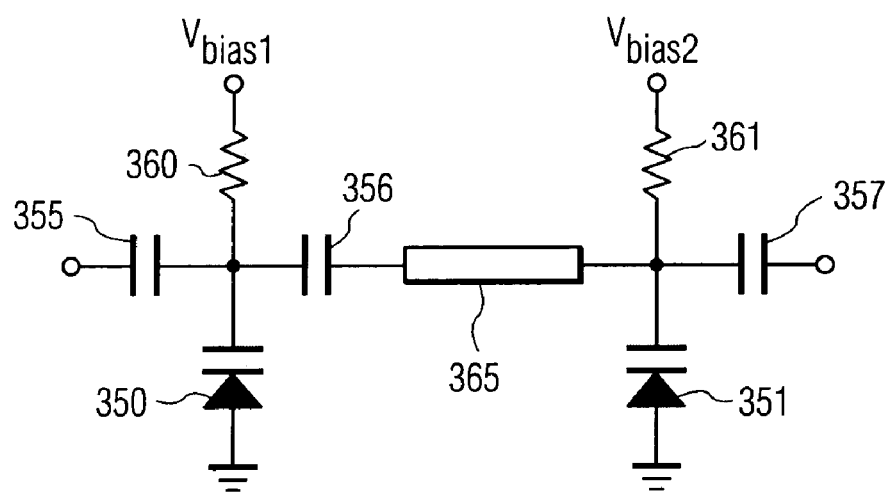
FIG. 6 shows an embodiment of an output impedance matching circuit.

FIG. 6 shows one exemplary embodiment of an output impedance matching circuit that may be utilized for one or more of the broadband output matching section 12 and the two single-band matching sections 16 and 18. The bias voltages $V_{bias1}$, and $V_{bias2}$ provide the capacitance values to varactors 350 and 351. Capacitors 355, 356 and 357 are DC blocking capacitors; and resistors 360 and 361 are desirably large to prevent R-F leakage.

Figure 7:
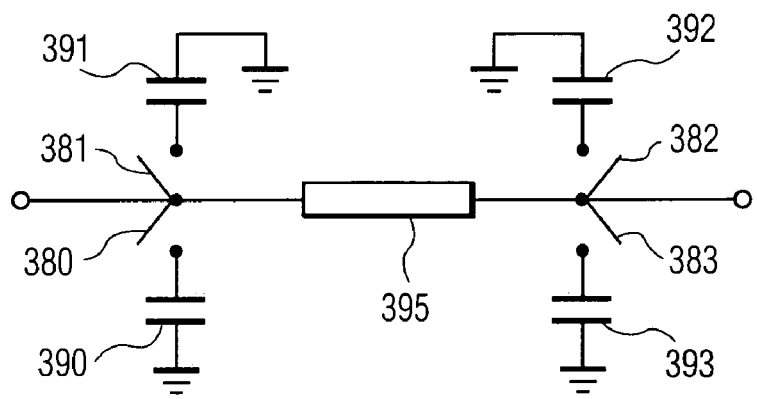
FIG. 7 shows an embodiment of an output impedance matching circuit.

FIG. 7 shows another embodiment of an output impedance matching circuit that may be utilized for one or more of the broadband output matching section 12 and the two single-band matching sections 16 and 18. Here, four single switches 380-383 and four capacitors 390-393 match the impedance values. Transmission line 395 is less than a quarter wave line providing inductive impedance. Note that the number of inputs in this and other embodiments may determine the component's composition. For example, if this embodiment is utilized within an embodiment having seven transistors, it may be desired to use fewer components, e.g. three capacitors, as they will provide the requisite matching for the seven possible outputs. Capacitors 390-393 are matching capacitors.

Figure 8:
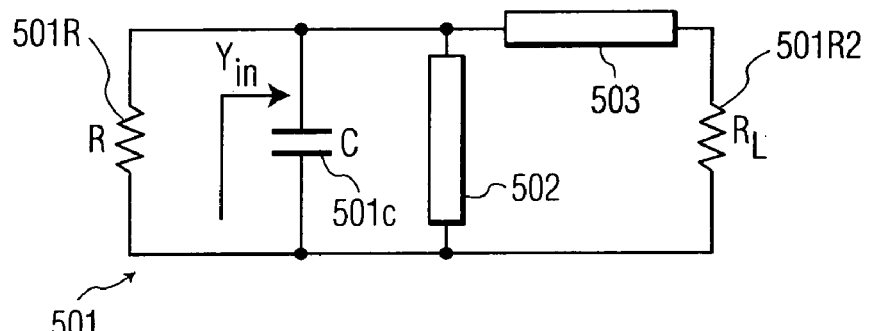
FIG. 8 shows an embodiment of an output impedance matching circuit.

Turning now to FIG. 8, another embodiment of an output impedance matching circuit is shown that may be utilized for one or more of the broadband output matching section 12 and the two single-band matching sections 16 and 18. Impedance matching in this embodiment uses a parallel-circuit Class E load network to increase efficiency, such as the type disclosed in U.S. Pat. No. 6,554,610. The parallel circuit load network is tuned to specific values for impedance, capacitance and resistance, according to the appropriate values of the system. The load network consists of resonant circuit 501, which includes capacitor 501C, resistor 501R (with resistance R) and load 501R2 (with resistance $R_L$), parallel short circuited transmission line 502, and quarter wave transmission line 503. Parallel short-circuited transmission line 502 and parallel capacitance 501C provide inductive impedance at a center frequency of $f_0=\sqrt{f_1 f_2}$, where $f_1$ is the low frequency band and $f_2$ is the high frequency band.

The inductive impedance of the load network may differ with different frequencies, of course. Generally, it is determined by:

$Z_{in1}=R/(1-j \tan 34.244°)$ at fundamental frequency.

where R is the required output resistance and $R_L=Z_{01}^2/R$. Any impedances at the higher-order harmonics should be capacitive.

In exemplary embodiments, optimum load network parameters may be defined by $$\tan\theta = 0.732 \frac{R}{Z_0} \quad C = \frac{0.685}{\omega R} \quad R = 1.365 \frac{V_{cc}^2}{P_{out}}$$

where $V_{CC}$ is the supply voltage, $P_{out}$ is the output power, and $Z_0$ and $\theta$ are characteristic impedance and electrical length of the parallel short circuited transmission line 502, respectively.

The capacitance C is the internal device capacitance (although some external output capacitance may be present as well, and should be factored accordingly), which is chosen as is known in the art for the appropriate frequencies. For example, if output impedance matching circuit is intended for a bipolar device, collector capacitance will be utilized. As another example, if output impedance matching circuit is intended for an FET device, then drain capacitance will be utilized.

Quarter-wave transmission line 503 will have impedance $Z_{01}$ and electrical length of $\theta 1=90.°$ Quarter-wave transmission line 503 can be considered as a high-frequency series resonant circuit and as such, effectively widens the overall frequency range. In other embodiments, of course, other methods as known in the art may be used as well, or none at all.

Figure 9:
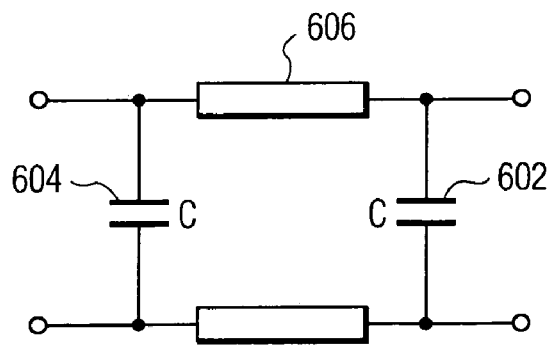
FIG. 9 shows an embodiment of an output impedance matching circuit.

Another alternative embodiment of an output impedance matching circuit that may be utilized for one or more of the broadband output matching section 12 and the two single-band matching sections 16 and 18 is shown in FIG. 9. Here two capacitors 602 and 604 and a shorter transmission line 606 are substituted for the quarter wave transmission line 503 of FIG. 8. The parameters of the components are defined by $$Z_{02} = \frac{Z_{01}}{\sin\theta_2} \quad C = \frac{\cos\theta_2}{\omega Z_{01}}$$

Figure 10:
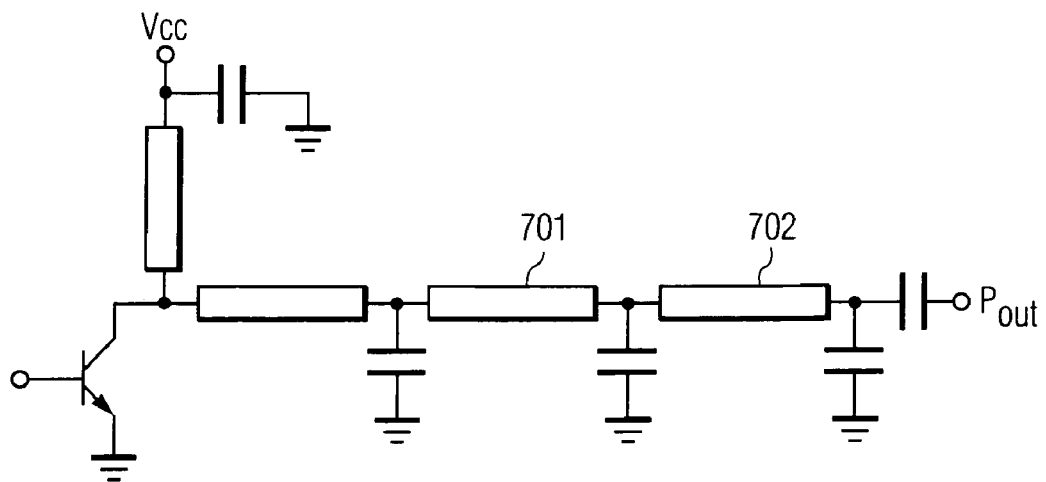
FIG. 10 shows an embodiment of an output impedance matching circuit.

Still another alternative embodiment of an output impedance matching circuit that may be utilized for one or more of the broadband output matching section 12 and the two single-band matching sections 16 and 18 is shown in FIG. 10. This embodiment is preferably used in broadband embodiments when output impedances are small, on the order of about 5 Ohms. Two L-section transformers 701 and 702 with series transmission lines and parallel capacitances are added to an embodiment such as shown in FIG. 9.

Of course, other embodiments may use other output impedance matching circuits, e.g., a low pass ladder filter.

In still other embodiments, one or more notch filters may be used within any of the output impedance matching circuits or band diplexer embodiments, thus further attenuating any undesirable frequencies. For example, suppression of the second harmonic of the signal at 840 MHz, (1.68 GHz) is desirable in a CDMA2000 embodiment. This harmonic will be within the power amplifier frequency bandwidth and so should be attenuated. Therefore, a notch filter may be used.

Figure 11:
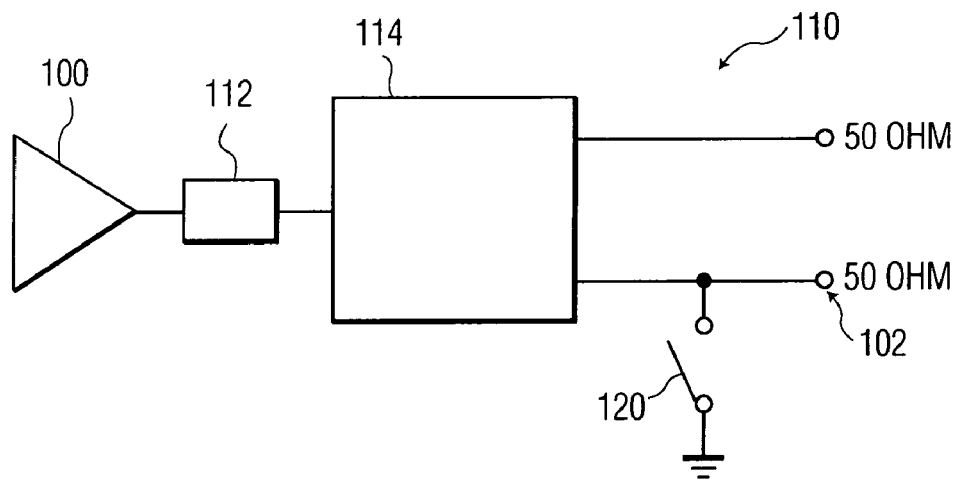
FIG. 11 shows an embodiment of an output matching configuration

Another embodiment of an output matching configuration in accordance with the present invention is illustrated in FIG. 11. In this embodiment, an output matching configuration 110 is shown comprising, as portions thereof, a broadband output matching circuit 112, a diplexer 114 and a PIN-diode switch 120. Distinct from the embodiment shown in FIG. 3, the broadband output matching circuit 112 provides for complete output impedance matching between an active device and a load over the entire frequency range, and accordingly, no single-band matching sections are provided. In the present embodiment, the diplexer 114 and the PIN-diode switch 120 are the same as the diplexer 14 and the PIN-diode 20 discussed above. In this embodiment, the broadband output matching circuit 112, the diplexer 114 and the PIN-diode switch 120 may take the form of any of a variety of suitable components or technologies, such as any one of the embodiments set forth above.

Figure 12:
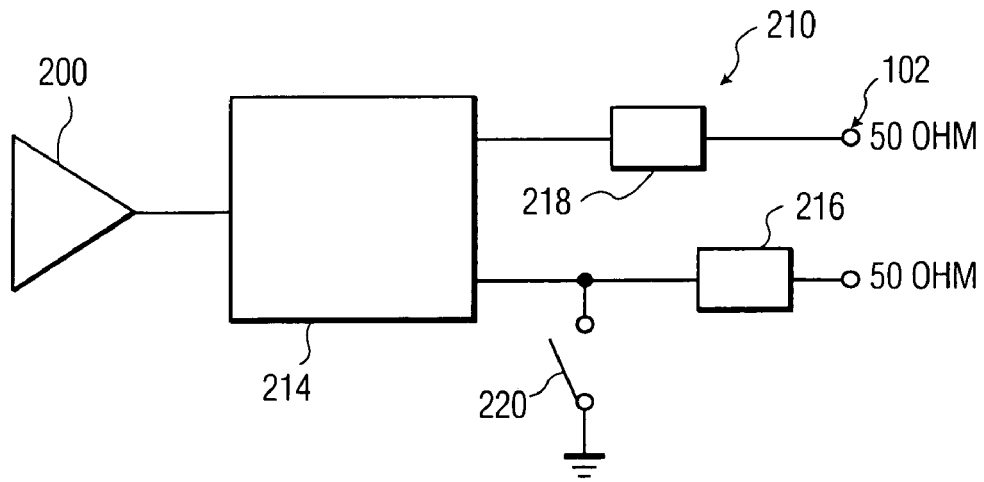
FIG. 12 shows an embodiment of an output matching configuration.

Still another embodiment of an output matching configuration in accordance with the present invention is illustrated in FIG. 12. In this embodiment, an output matching configuration 210 is shown comprising a diplexer 214 connected directly to an active device 200. For example, where the active device 200 comprises a power amplifier, the diplexer 214 may be connected to a transistor of the power amplifier, for example, at the collector. The output matching configuration 210 in this embodiment further comprises two single-band matching sections 216 and 218, respectively, and a PIN-diode switch 220, similar to the single-band matching sections 16 and 18, and the PIN-diode switch 20 shown in FIG. 3. Similarly, in this embodiment the components of the output matching configuration 210 may take the form of any of a variety of suitable components or technologies, such as any one of the embodiments set forth above.

Embodiments of the present invention may be used in dual and other multi-band architectures, such as with cellular phones. Examples of dual band architectures include GSM900/DCS1800 or CDMA2000. Examples of triple band architectures are GSM900/DCS 1800/PCS 1900 or CDMA2000/PCS 1900.

Various types of system architectures may be utilized for constructing the embodiments of the present invention. One of ordinary skill in the art, will accordingly appreciate that embodiments of the invention or various components and/or features thereof may be entirely comprised of hardware, software or may be a combination of software and hardware. While the invention has been described by illustrative embodiments, additional advantages and modifications will occur to those skilled in the art. For example, while an active device is illustrated comprising a power amplifier in the various embodiments, the active device can comprise other components as well, such as, for example, an attenuator. Therefore, the invention in its broader aspects is not limited to specific details shown and described herein. Modifications may be made without departing from the spirit and scope of the invention. Accordingly, it is intended that the invention not be limited to the specific illustrative embodiments, but be interpreted within the full spirit and scope of the appended claims and their equivalents.

We claim:

1. An apparatus for output impedance matching for a multi-band signal processor comprising:

a multi-band diplexer adapted for receiving input signals having a defined frequency band and generating at least first and second output signals, wherein the first output signals are of a frequency band that is higher than a frequency band of the second output signals; and at least one switch through which the first output signals from the multi-band diplexer pass, the switch having on and off states, the switch being in an on state when the input signals are of a first frequency band, for suppressing undesired harmonics, and the switch being in an off state when the input signals are of a second frequency band.

2. An apparatus according to claim 1, further comprising at least one impedance matching section connected with the multi-band diplexer through which at least one of the first output signals and the second output signals are passed.

3. An apparatus according to claim 1, further comprising a first impedance matching section connected with the multi-band diplexer through which the second output signals pass.

4. An apparatus according to claim 3, further comprising a second impedance matching section connected with the switch through which the first output signals pass.

5. An apparatus according to claim 1, wherein the multi-band signal processor comprises an active device for transmitting the input signals that are received by the multi-band diplexer, the apparatus farther comprising an impedance matching section connected between the active device and the multi-band diplexer through which the input signals pass.

6. An apparatus according to claim 1, wherein the multi-band signal processor comprises an active device transmitting the input signals that are received by the multi-band diplexer, and a load receiving the first and second output signals generated by the multi-band diplexer, the apparatus further comprising:
- an impedance matching section connected between the active device and the multi-band diplexer through which the input signals pass;
- a first impedance matching section connected between the multi-band diplexer and the load through which the second output signals pass; and
- a second impedance matching section connected between the switch and the load through which the first output signals pass.

7. An apparatus according to claim 1, wherein the switch comprises a PIN-diode.

8. An apparatus according to claim 1, wherein the input signals comprise the second frequency band being of a higher frequency band than the first frequency band.

9. An apparatus according to claim 1, wherein the multi-band signal processor comprises an active device transmitting the input signals that are received by the multi-band diplexer, the active device being selected from the group consisting of a power amplifier and an attenuator.

10. A method for output matching in a multi-band signal processor comprising:
- receiving input signals having a defined frequency band and generating at least first and second output signals to a load, with the first output signals being of a frequency band that is higher than a frequency band of the second output signals; and
- regulating the first output signals according to the defined frequency band of the input signals, with undesired harmonics being suppressed from the first output signals when the input signals are of a first frequency band;
- wherein the first output signals are regulated by at least one switch having on and off states, the method further comprising operating the switch in an on state when the input signals are of the first frequency band, for suppressing undesired harmonics, and operating the switch in an off state when the input signals are of a second frequency band.

11. A method according to claim 10, further comprising matching impedances of the first and second output signals separately.

12. A method according to claim 11, wherein the receiving and generating step comprises a multi-band diplexer, and the step of matching impedances further comprises:
- providing a first impedance matching section between the multi-band diplexer and the load through which the second output signals pass; and
- providing a second impedance matching section between the multi-band diplexer and the load through which the first output signals pass.

13. A method according to claim 10, wherein the multi-band signal processor comprises an active device transmitting the input signals, and wherein the receiving and generating step comprises a multi-band diplexer, the method further comprising providing an impedance matching section between the active device and the multi-band diplexer through which the input signals pass.

14. An amplifier output impedance matching configuration comprising:
- a multi-band diplexer receiving input signals having a defined frequency band from a power amplifier and generating at least first and second output signals to a load, wherein the first output signals are of a frequency band that is higher than a frequency band of the second output signals;
- at least one switch connected between the multi-band diplexer and the load for receiving the first output signals from the multi-band diplexer, the switch having on and off states, the switch being in an on state when the input signals are of a first frequency band, for suppressing undesired harmonics, and the switch being in an off state when the input signals are of a second frequency band; and
- one or more impedance matching sections connected between at least one of:
  - the multi-band diplexer and the load through which at least one of the first outputs signals and the second output signals are passed; and
  - the power amplifier and the multi-band diplexer through which the input signals pass.

15. An amplifier output impedance matching configuration according to claim 14 further comprising a first impedance matching section connected between the multi-band diplexer and the load through which the second output signals pass and a second impedance matching section connected between the switch and the load through which the first output signals pass.

16. An amplifier output impedance matching configuration according to claim 14, further comprising:
- an impedance matching section connected between the power amplifier and the multi-band diplexer through which the input signals pass;
- a first impedance matching section connected between the multi-band diplexer and the load through which the second output signals pass; and a second impedance matching section connected between the switch and the load through which the first output signals pass.

17. An amplifier output impedance matching configuration according to claim 14, wherein the switch comprises a PIN-diode.

18. An amplifier output impedance matching configuration according to claim 14, wherein the input signals comprise the second frequency band being of a higher frequency band than the first frequency band.

19. A method for output matching in a multi-band signal processor comprising:
- receiving input signals having a defined frequency band and generating at least first and second output signals to a load, with the first output signals being of a frequency band that is higher than a frequency band of the second output signals; and
- regulating the first output signals according to the defined frequency band of the input signals, with undesired harmonics being suppressed from the first output signals when the input signals are of a first frequency band;

matching impedances of the first and second output signals separately;

wherein the receiving and generating step comprises a multi-band diplexer, and the step of matching impedances further comprises:

providing a first impedance matching section between the multi-band diplexer and the load through which the second output signals pass; and providing a second impedance matching section between the multi-band diplexer and the load through which the first output signals pass.

* * * * *